United States Patent
Zang et al.

(10) Patent No.: US 10,707,207 B1
(45) Date of Patent: Jul. 7, 2020

(54) METHOD, APPARATUS, AND SYSTEM FOR IMPROVED GATE CONNECTIONS ON ISOLATION STRUCTURES IN FINFET DEVICES

(71) Applicant: GLOBALFOUNDRIES INC., Grand Cayman (KY)

(72) Inventors: Hui Zang, Guilderland, NY (US); Dali Shao, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/277,496

(22) Filed: Feb. 15, 2019

(51) Int. Cl.
| | |
|---|---|
| H01L 21/20 | (2006.01) |
| H01L 29/94 | (2006.01) |
| H01L 27/088 | (2006.01) |
| H01L 29/66 | (2006.01) |
| H01L 21/8234 | (2006.01) |
| H01L 21/762 | (2006.01) |

(52) U.S. Cl.
CPC .... *H01L 27/0886* (2013.01); *H01L 21/76224* (2013.01); *H01L 21/823431* (2013.01); *H01L 21/823481* (2013.01); *H01L 29/66795* (2013.01)

(58) Field of Classification Search
CPC ............... H01L 27/0886; H01L 21/31055
USPC ............................................. 257/308; 438/399
See application file for complete search history.

(56) References Cited

U.S. PATENT DOCUMENTS

| | | | | |
|---|---|---|---|---|
| 6,261,935 | B1 | 7/2001 | See et al. | |
| 9,219,153 | B2 * | 12/2015 | Xie | H01L 29/785 |
| 9,691,764 | B2 * | 6/2017 | Kawa | G06F 30/392 |
| 9,899,267 | B1 * | 2/2018 | Liou | H01L 21/823878 |
| 10,177,037 | B2 * | 1/2019 | Zang | H01L 21/823437 |
| 10,522,546 | B2 * | 12/2019 | Liaw | H01L 27/0207 |
| 10,529,833 | B2 * | 1/2020 | Ching | H01L 29/161 |

* cited by examiner

*Primary Examiner* — Calvin Lee
(74) *Attorney, Agent, or Firm* — Williams Morgan, P.C.

(57) ABSTRACT

A semiconductor device, comprising first and second sets of fins; first and second gate electrodes; first and second isolation structures each separating one of the gate electrodes into a first portion and a second portion; and first and second conductive structures wider than the corresponding isolation structure and disposed on an entirety of a top of the corresponding isolation structure and on a part of the top of each of the first and second portions of the corresponding gate electrode. A method for making the semiconductor device. A system configured to implement the method and manufacture the semiconductor device. The semiconductor device may have a low parasitic capacitance and high chip performance.

6 Claims, 12 Drawing Sheets

METHOD, APPARATUS, AND SYSTEM FOR IMPROVED GATE CONNECTIONS ON ISOLATION STRUCTURES IN FINFET DEVICES

BACKGROUND OF THE INVENTION

Field of the Invention

Generally, the present disclosure relates to sophisticated semiconductor devices, and, more specifically, to semiconductor devices with improved gate connections on isolation structures.

Description of the Related Art

In an effort to maintain Moore's Law as a self-fulfilling prophecy, the semiconductor industry in recent years has sought to reduce the sizes of semiconductor devices. Efforts to do so have led to the development of FinFET devices, in which a gate electrode is disposed on the tops and sides of a fin providing the gate channel. Sources and drains may be formed in or on the fin in proximity to the gate.

Gate electrodes, sources, and drains require contacts, frequently comprising metal, to allow signals to travel to and from the gate, source, and drain on the one hand and other components of the semiconductor device on the other. However, if contacts to sources and/or drains are relatively close to gate electrodes, which is essentially required to reduce FinFET device dimensions, and the contacts and gate electrodes are insufficiently electrically isolated, parasitic capacitance may arise, which degrades device performance. In many cases, parasitic capacitance may contribute to an increase in the overall effective capacitance of one or more circuit formed from the finFET devices, which may degrade performance of a semiconductor chip containing the finFET devices.

Accordingly, it would be desirable to have a semiconductor device with low parasitic capacitance and high performance.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one embodiment, the present disclosure is directed to a semiconductor device, comprising a semiconductor substrate; a first set of fins and a second set of fins disposed on the semiconductor substrate, wherein every fin comprises a long axis and a short axis, wherein the long axes of the fins are substantially parallel and extend in a first direction; a first gate electrode and a second gate electrode over the semiconductor substrate, the first set of fins, and the second set of fins, wherein each gate electrode comprises a long axis and a short axis, wherein the long axes of the first and second gate electrodes are substantially parallel and extend in a second direction, wherein the second direction is substantially perpendicular to the first direction; a first isolation structure disposed between the first set of fins and the second set of fins and on the semiconductor substrate, wherein the first isolation structure separates the first gate electrode into a first portion and a second portion; a second isolation structure disposed between the first set of fins and the second set of fins and on the semiconductor substrate, wherein the second isolation structure separates the second gate electrode into a first portion and a second portion; a third isolation structure disposed on a first part of a top of each of the first and second portions of the first gate electrode; a fourth isolation structure disposed on a first part of a top of each of the first and second portions of the second gate electrode; a first conductive structure wider than the first isolation structure and disposed on an entirety of a top of the first isolation structure and on a second part of the top of each of the first and second portions of the first gate electrode; and a second conductive structure wider than the second isolation structure and disposed on an entirety of a top of the second isolation structure and on a second part of the top of each of the first and second portions of the second gate electrode.

In one embodiment, the present disclosure is directed to a method, comprising forming a semiconductor substrate; forming a first set of fins and a second set of fins on the semiconductor substrate, wherein every fin comprises a long axis and a short axis, wherein the long axes of the fins are substantially parallel and extend in a first direction; forming a first gate structure and a second gate structure over the semiconductor substrate, the first set of fins, and the second set of fins, wherein each gate structure comprises a long axis and a short axis, wherein the long axes of the first and second gate structures are substantially parallel and extend in a second direction, wherein the second direction is substantially perpendicular to the first direction; forming a first trench in the first gate structure and a second trench in the second gate structure, wherein each trench is formed between the first set of fins and the second set of fins and exposes the semiconductor substrate; filling the first trench and the second trench with a first isolation material, to yield a first isolation structure and a second isolation structure, wherein the first gate structure has a first portion and a second portion separated by the first isolation structure and the second gate structure has a first portion and a second portion separated by the second isolation structure; depositing a second isolation material over at least the first gate structure and the second gate structure; forming a third trench and a fourth trench in the second isolation material, wherein the third trench exposes an entirety of a top of the first isolation structure, at least a part of a top of the first portion of the first gate structure, and at least a part of a top of the second portion of the first gate structure, and the fourth trench exposes an entirety of a top of the second isolation structure, at least a part of a top of the first portion of the second gate structure, and at least a part of a top of the second portion of the second gate structure; and filling the third and fourth trenches with a conductive material.

In one embodiment, the present disclosure is directed to a manufacturing system, configured to manufacture a semiconductor device, such as the semiconductor device referred to above.

Embodiments herein may provide for semiconductor devices with low parasitic capacitance and high performance.

BRIEF DESCRIPTION OF THE DRAWINGS

The disclosure may be understood by reference to the following description taken in conjunction with the accompanying drawings, in which like reference numerals identify like elements, and in which.

Figure 1:
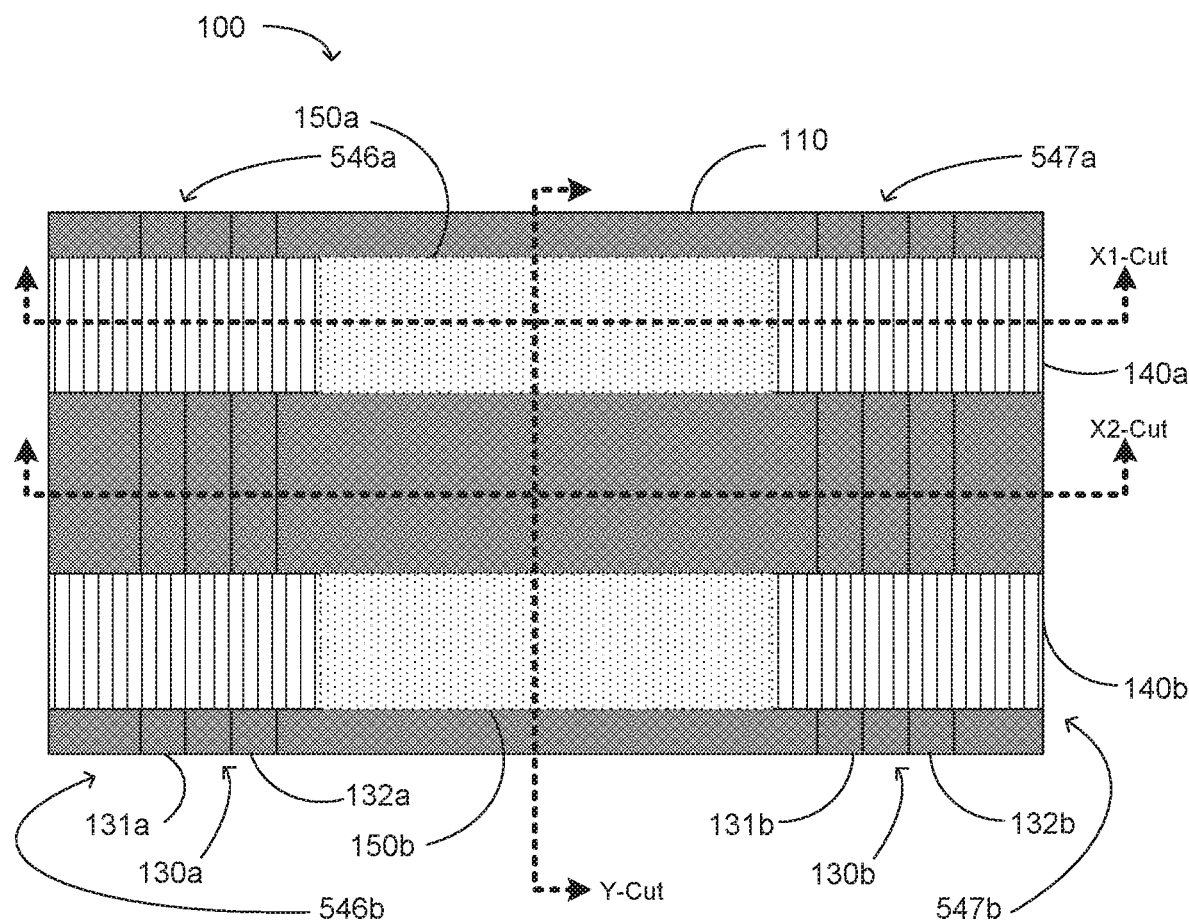
FIG. 1 illustrates a stylized plan view of a semiconductor device, showing X1-cut, X2-cut, and Y-cut lines, in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. Moreover, the stylized depictions illustrated in the drawings are not drawn to any absolute scale.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems, and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for improved scaling of isolation structures for contacts to gates, sources, and/or drains in semiconductor devices. Embodiments here provide for processing methods that may reduce excessive depth of a trench silicide (TS) feature, which may reduce parasitic capacitance, which in turn, may reduce the effective capacitance. This may result in an improvement of the performance of a circuit. Embodiments herein may provide for forming a buried TS overlap feature wherein a dielectric material may be formed in a portion of a gate region. One advantage of implementing embodiments herein may include a reduction in effective capacitance of a circuit as a result of reducing excessive depth. Another advantage may include improved TS formation control as a result of improved selectivity of high-K as a contact etch-stop layer (CESL). Still further, another advantage may include improved profile of epitaxial (EPI) features, which may also contribute to improved performance. Turning now to FIG. 1, we provide a stylized plan view of a semiconductor device 100, showing X1-cut, X2-cut, and Y-cut lines, in accordance with embodiments herein. The plan or top-down view of FIG. 1 may omit one or more layers or structures that would be positioned over part or all of the semiconductor device 100 or one or more components thereof after one or more stages of processing, for convenience in drawing the reader's attention to particular features shown in FIG. 1 and other figures and described below.

One component of the semiconductor device 100 shown in FIG. 1 is a semiconductor substrate 110. The semiconductor substrate 110 provides a foundation layer upon which and/or from which other layers and structures of semiconductor device 100 may be formed. The semiconductor substrate 110 may comprise any suitable materials or layers known to the person of ordinary skill in the art. The semiconductor substrate 110 may comprise silicon, silicon-germanium, a silicon oxide layer disposed on a silicon layer, or other structures. In one embodiment, the semiconductor substrate 110 comprises silicon.

The semiconductor device 100 also comprises a first set of fins 130a (comprising, in the depicted embodiment, fin 131a and fin 132a) and a second set of fins 130b (comprising, in the depicted embodiment, fin 131b and fin 132b). As depicted, the fins 131a-132b may be formed of the same material as the semiconductor substrate 110. In other embodiments, the fins 131a-132b may be formed of materials other than that of the semiconductor substrate 110. Generally, the fins 131a-132b may be formed of any material which may provide a channel for a field-effect transistor.

As can be seen in the plan view of FIG. 1, the first set of fins 130a and the second set of fins 130b each comprise a long axis (extending vertically on the page) and a short axis (extending horizontally on the page), wherein the long axes of all the fins 131a-132b are substantially parallel and extend in a first direction. In the depicted stylized plan view of FIG. 1, the first direction is vertical on the page.

Although FIG. 1 depicts each set of fins 130a and 130b as comprising two fins each, in other embodiments, one or more of the sets of fins 130a and 130b may comprise one, two, three, four, or another number of fins. The number of fins may be the same or may differ between sets of fins 130a and 130b.

The semiconductor device 100 additionally comprises a first gate structure 140a and a second gate structure 140b, each disposed on the semiconductor substrate 110, the first set of fins 130a, and the second set of fins 130b. By "gate structure" is meant both dummy gate structures intended for replacement metal gate (RMG) processes and final gate structures (which may be termed a "gate stack") typically comprising a high-κ (i.e., κ>≈6) gate dielectric layer, a metal gate electrode, and various spacers and capping layers. In one embodiment, the first gate structure 140a and the second gate structure 140b each comprise a high-κ gate dielectric; a metal gate electrode; a capping layer disposed on the metal gate electrode; and a spacer disposed on sides of the metal gate electrode and sides of the capping layer.

The first gate structure 140a and the second gate structure 140b each comprise a long axis and a short axis, wherein the long axes of the first and second gate structures are substantially parallel and extend in a second direction (e.g., horizontally on the page in FIG. 1), wherein the second direction is substantially perpendicular to the first direction.

The semiconductor device 100 also comprises a first isolation structure 150a and a second isolation structure 150b. The first isolation structure 150a is disposed on the semiconductor substrate 110 and between the first set of fins 130a and the second set of fins 130b. The first isolation structure 150a has a width in the first direction at least as wide as the width in the first direction of the first gate structure 140a. As shown in the depicted embodiment, the long sides of the first isolation structure 150a may be aligned with the long sides of the first gate structure 140a. Accordingly, the first isolation structure 150a separates the first gate structure 140a into a first portion 546a and a second portion 547a.

The first isolation structure 150a may comprise any electrically insulating material. Typically, an electrically-insulating material has a dielectric constant κ greater than that of air. In one embodiment, the first isolation structure 150a may comprise silicon nitride.

The description given above regarding the first isolation structure 150a fully applies to the second isolation structure 150b.

Subsequent stylized cross-sectional depictions of the semiconductor device 100 according to embodiments herein will be taken along one of three cuts, an X1-cut (perpendicular to and across the long axes of the sets of fins 130a and 130b, and along the long axis of the first gate structure 140a and the first isolation structure 150a), a X2-cut (perpendicular to and across the long axes of the sets of fins 130a and 130b, in a region of the semiconductor device 100 between the gate structures 140a and 140b), and a Y-cut (perpendicular to and across the long axes of the gate structures 140a and 140b and first and second isolation structures 150a and 150b between the sets of fins 130a and 130b). Generally, each stage of manufacture of the semiconductor device 100, a depiction taken along the X1-cut (showing a cross-section of the first gate structure 140a and the first isolation structure 150a) would fully apply to a cut (not shown) along the long axis of the second gate structure 140b and the second isolation structure 150b.

FIGS. 2-20 illustrate stylized cross-sectional depictions of the semiconductor device 100 under various stage of manufacture, in accordance with embodiments herein.

Figure 2:
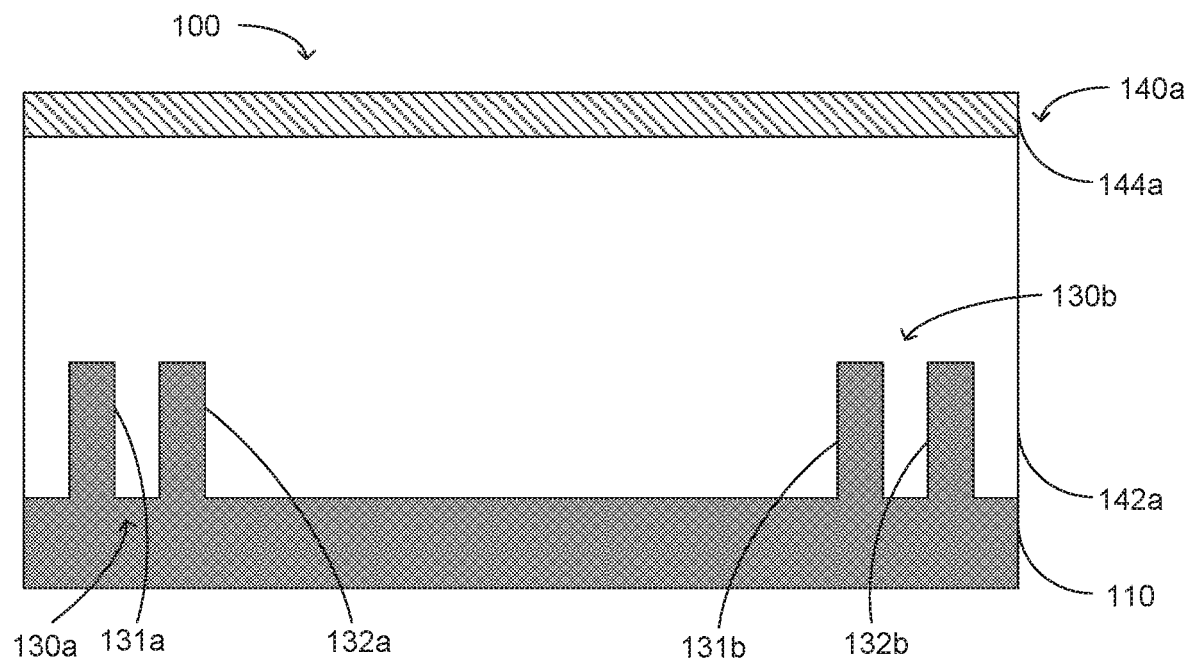
FIG. 2 illustrates an X1-cut view of a semiconductor device after a first stage of processing, in accordance with embodiments herein.
Figure 3:
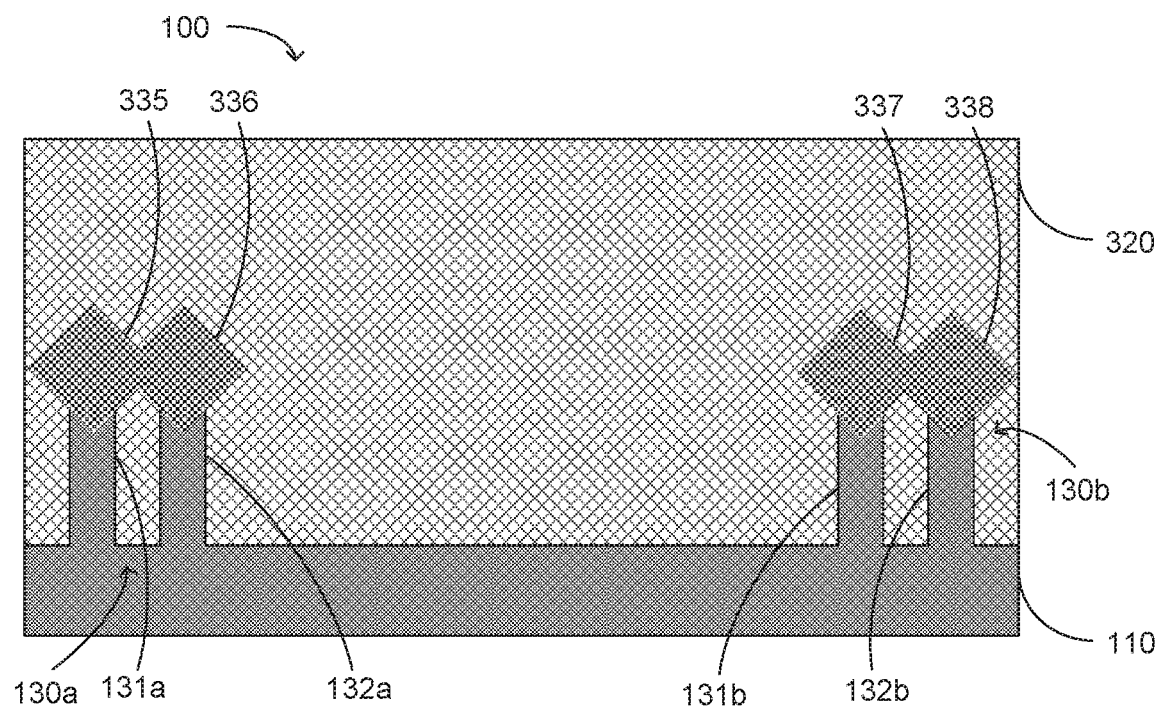
FIG. 3 illustrates an X2-cut view of a semiconductor device after the first stage of processing, in accordance with embodiments herein.
Figure 4:
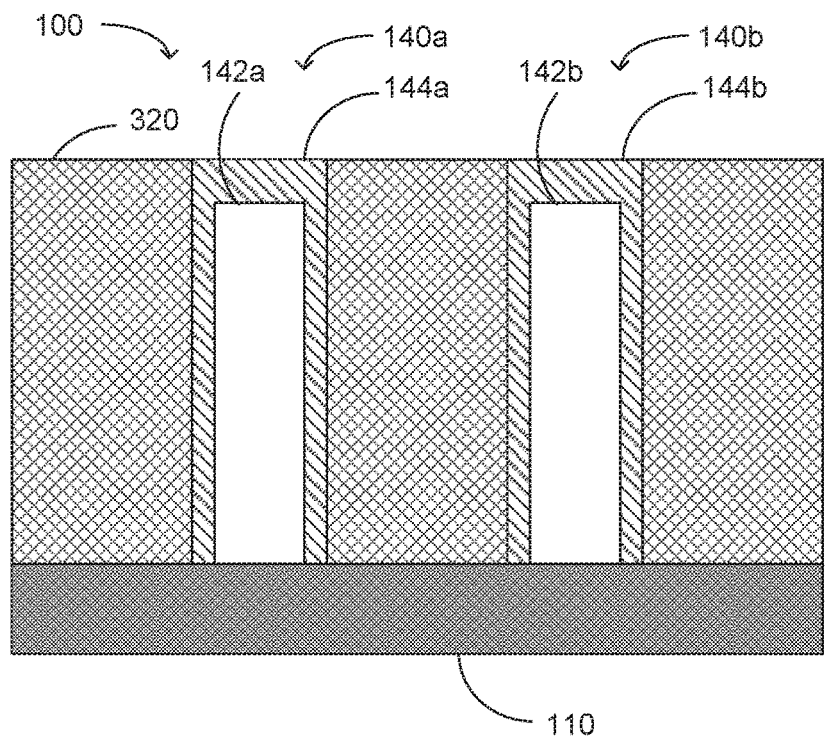
FIG. 4 illustrates a Y-cut view of a semiconductor device after the first stage of processing, in accordance with embodiments herein.

FIG. 2 illustrates an X1-cut view, FIG. 3 illustrates an X2-cut view, and FIG. 4 illustrates a Y-cut view of the semiconductor device 100 after a first stage of processing, in accordance with embodiments herein. In the first stage of processing, several structures are formed on or from semiconductor substrate 110. The first set of fins 130a, comprising fins 131a and 132a, and the second set of fins 130b, comprising fins 131b and 132b, may be formed by providing a semiconductor substrate 110 and performing known lithography techniques to etch back the semiconductor substrate 110 to the height shown in FIGS. 2-4, yielding fins 131a-132b.

Also in the first stage of processing, as shown in FIG. 2 and FIG. 4, a first dummy gate 142a and a first spacer layer 144a may be formed in the region of the first gate structure 140a shown in FIG. 1. Similarly, a second dummy gate 142b and a second spacer layer 144b may be formed in the region of the second gate structure 140b shown in FIG. 1. The first and second dummy gates 142a and 142b may each comprise a gate polycarbonate ("poly") material. The first spacer layer 144a and the second spacer layer 144b may each comprise amorphous silicon, silicon nitride, or other known materials.

Additionally in the first stage of processing, as depicted in FIG. 3, source/drain (S/D) structures 335, 336, 337, and 338 may be formed on every fin. The S/D structures 335-338 are formed on each fin 131a-132b at a position between the first gate structure 140a and the second gate structure 140b. Any technique for forming S/D structures known to the person of ordinary skill in the art may be used.

In one embodiment, the S/D structures 335-338 may be formed by epitaxial growth of silicon or silicon-germanium atop fins 131a-132b. In an epitaxial growth process, and as depicted in FIG. 3, the S/D structures on adjacent fins, e.g. S/D structures 335 and 336 on the one hand, and S/D structures 3737 and 338 on the other, may merge. However, merging of S/D structures is not required in an epitaxial growth process.

Further in the first stage of processing, an isolation structure 320 may be deposited over the sets of fins 130a and 130b and adjacent to the dummy gates 142a and 142b. The isolation structure 320 may comprise any electrically-insulating material, such as an oxide, e.g. $SiO_2$. Techniques to form isolation structure 320 will be known to the person of ordinary skill in the art and need not be described in detail.

Figure 5:
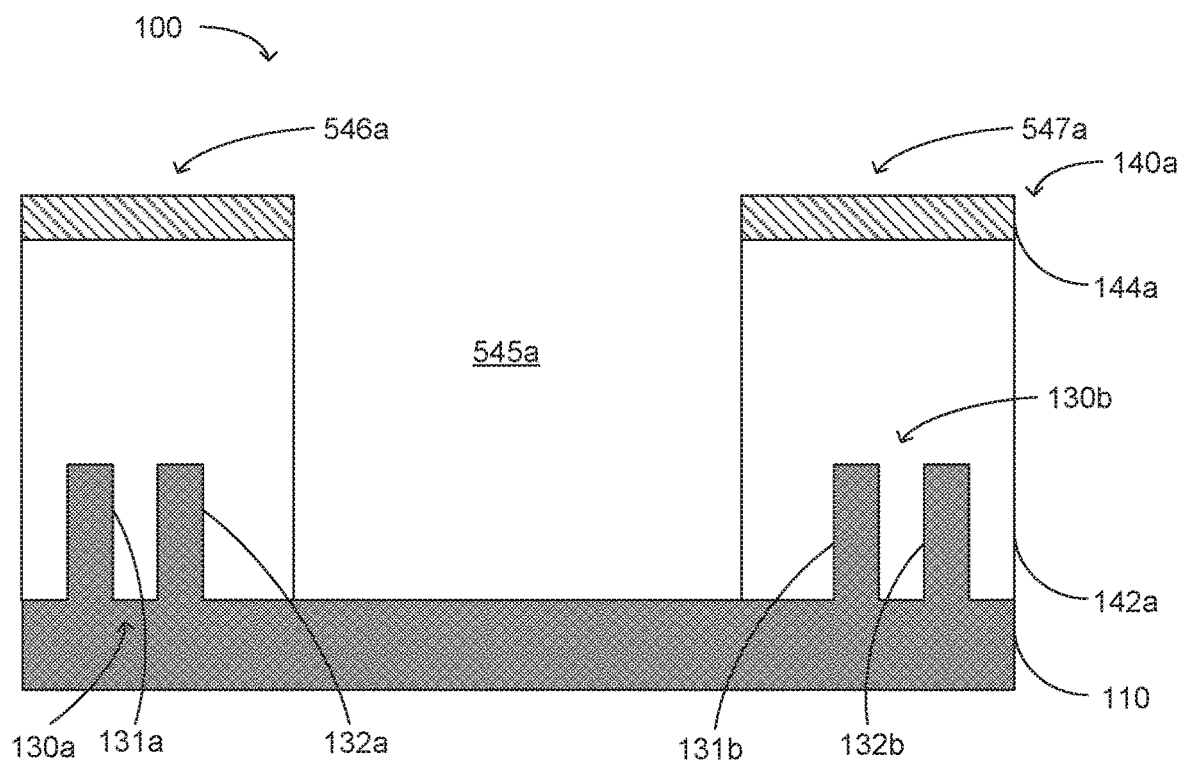
FIG. 5 illustrates an X1-cut view of a semiconductor device after a second stage of processing, in accordance with embodiments herein.
Figure 6:
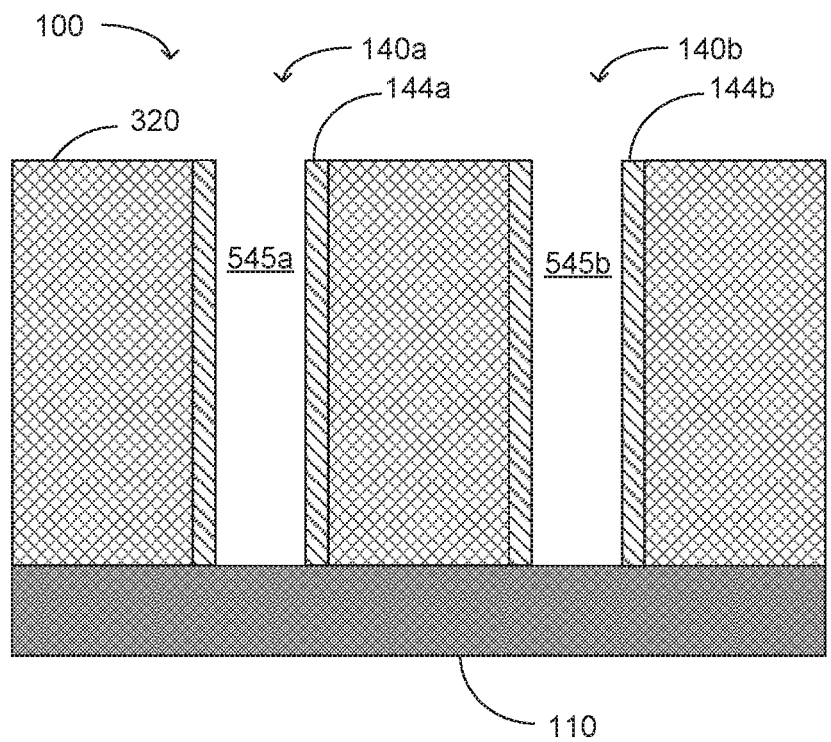
FIG. 6 illustrates a Y1-cut view of a semiconductor device after the second stage of processing, in accordance with embodiments herein.

FIG. 5 illustrates an X1-cut view and FIG. 6 illustrates an Y1-cut view of the semiconductor device 100 after the second stage of processing, in accordance with embodiments herein. In the second stage of processing, the semiconductor device 100 is not changed in the X2-cut view, and accordingly, an X2-cut view of the semiconductor device 100 after the second stage of processing is omitted for brevity. Generally, in FIGS. 2-19, a cut view will be omitted if it would be unchanged since the previous depiction of this cut view.

In the second stage of processing, a first trench 545a is formed in the first gate structure 140a (e.g., as depicted, in the first dummy gate 142a and the first spacer 144a atop but not along the sides of the first dummy gate 142a) and a second trench 545b is formed in the second gate structure 140b, wherein each trench is formed between the first set of fins 130a and the second set of fins 130b and exposes the semiconductor substrate 110 at the bottom of the trench 545a or 545b. Forming the first and second trenches 545a and 545b may be performed by patterning and etching techniques, e.g. reactive ion etch (RIE) techniques, with which the person of ordinary skill in the art will be familiar and which need no further discussion.

Figure 7:
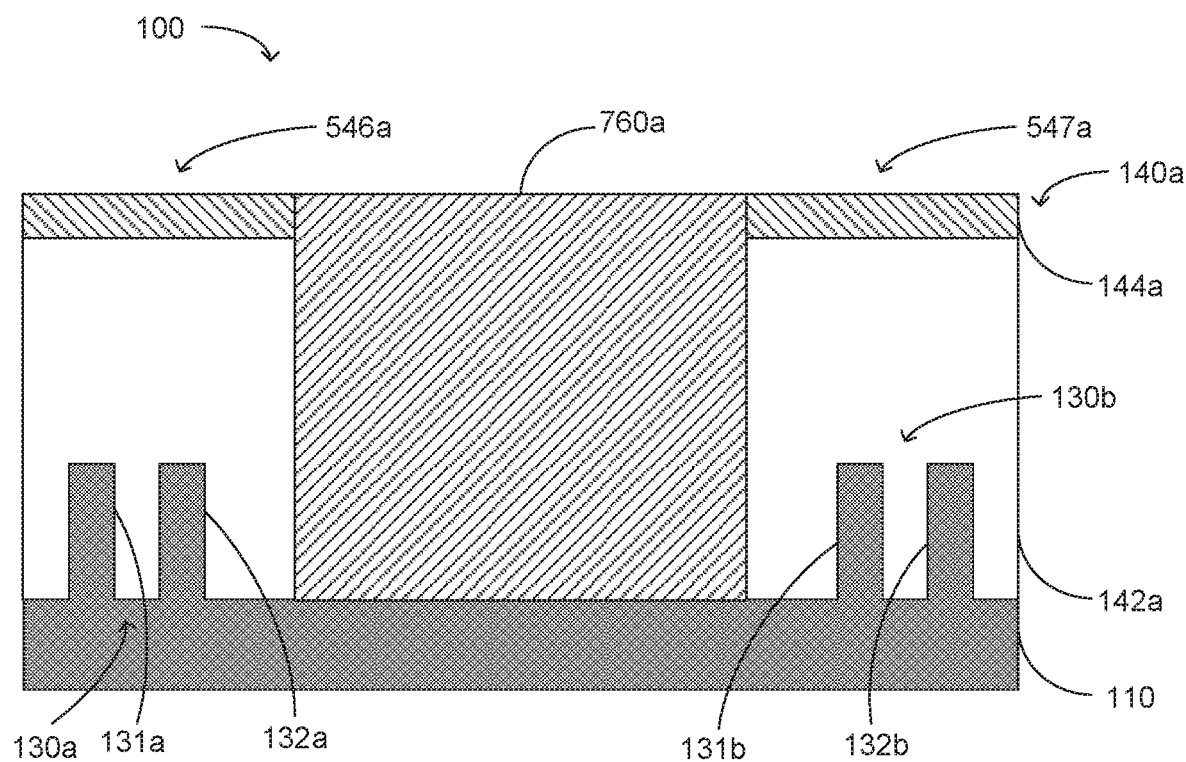
FIG. 7 illustrates an X1-cut view of a semiconductor device after a third stage of processing, in accordance with embodiments herein.
Figure 8:
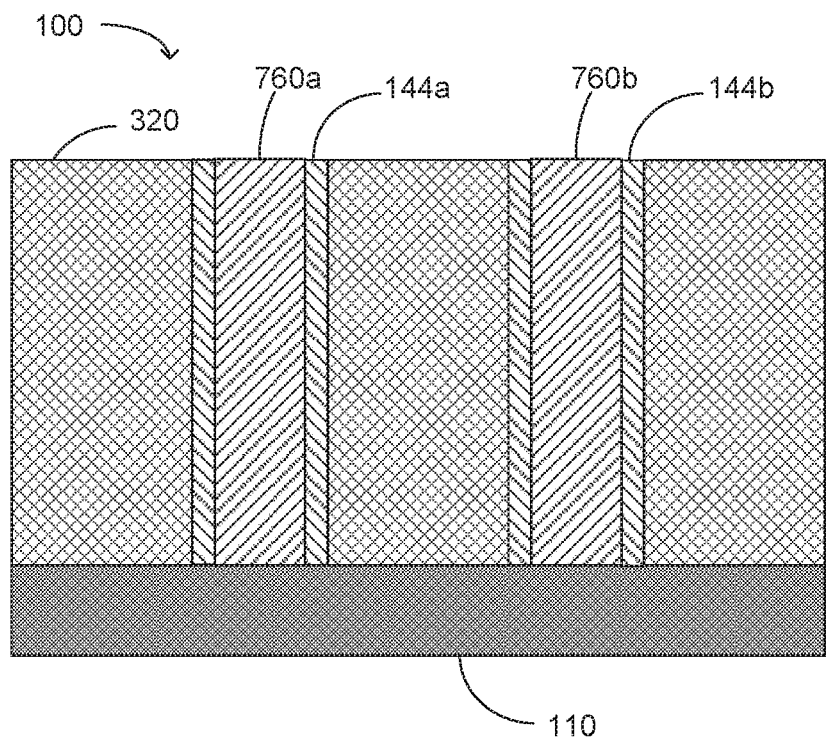
FIG. 8 illustrates a Y-cut view of a semiconductor device after the third stage of processing, in accordance with embodiments herein.

FIG. 7 illustrates an X1-cut view and FIG. 8 illustrates a Y-cut view of the semiconductor device 100 after a third stage of processing, in accordance with embodiments herein. In the third stage of processing, the first trench 545a and the second trench 545b are filled with a first isolation material, to yield a first isolation structure 760a and a second isolation structure 760b. The first isolation material may be any electrically-insulating material. In one embodiment, the first isolation material may be silicon nitride. The person of ordinary skill in the art will be aware of isolation materials and techniques for filling trenches therewith.

After the third stage of processing, the first gate structure 140a has a first portion 546a and a second portion 547a which are separated by the first isolation structure 760a. Similarly, though not explicitly shown, the second gate structure 140b has a first portion and a second portion separated by the second isolation structure 760b.

Figure 9:
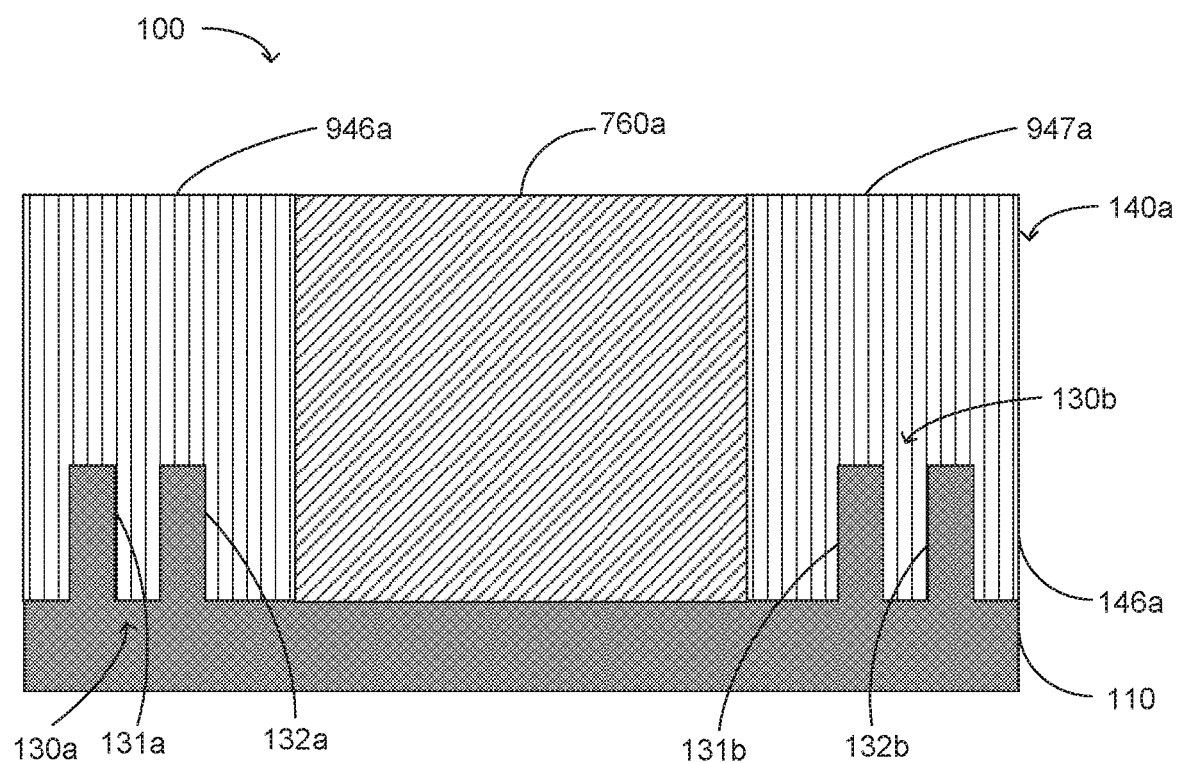
FIG. 9 illustrates an X1-cut view of a semiconductor device after a fourth stage of processing, in accordance with embodiments herein.

FIG. 9 illustrates an X1-cut view of the semiconductor device 100 after a fourth stage of processing, in accordance with embodiments herein. In the fourth stage of processing, a replacement metal gate (RMG) process may be performed, thereby replacing the first dummy gate 142a and the first spacer 144a atop the first dummy gate 142a with a first gate electrode 146a. Not shown are other layers and structures required to replace a dummy gate with a final gate structure, which may be referred to as a "gate stack" and typically comprises a high-κ (i.e., κ>≈6) gate dielectric layer, a metal gate electrode, and various spacers and capping layers. In one embodiment, the first gate structure 140a and the second gate structure 140b each comprise a high-κ gate dielectric; the gate electrode (e.g., gate electrode 146a of the first gate structure 140a); a capping layer disposed on the metal gate electrode; and a spacer disposed on sides of the metal gate electrode and sides of the capping layer.

Similarly, though not shown in FIG. 9, the second dummy gate may be replaced with a second gate electrode.

Figure 10:
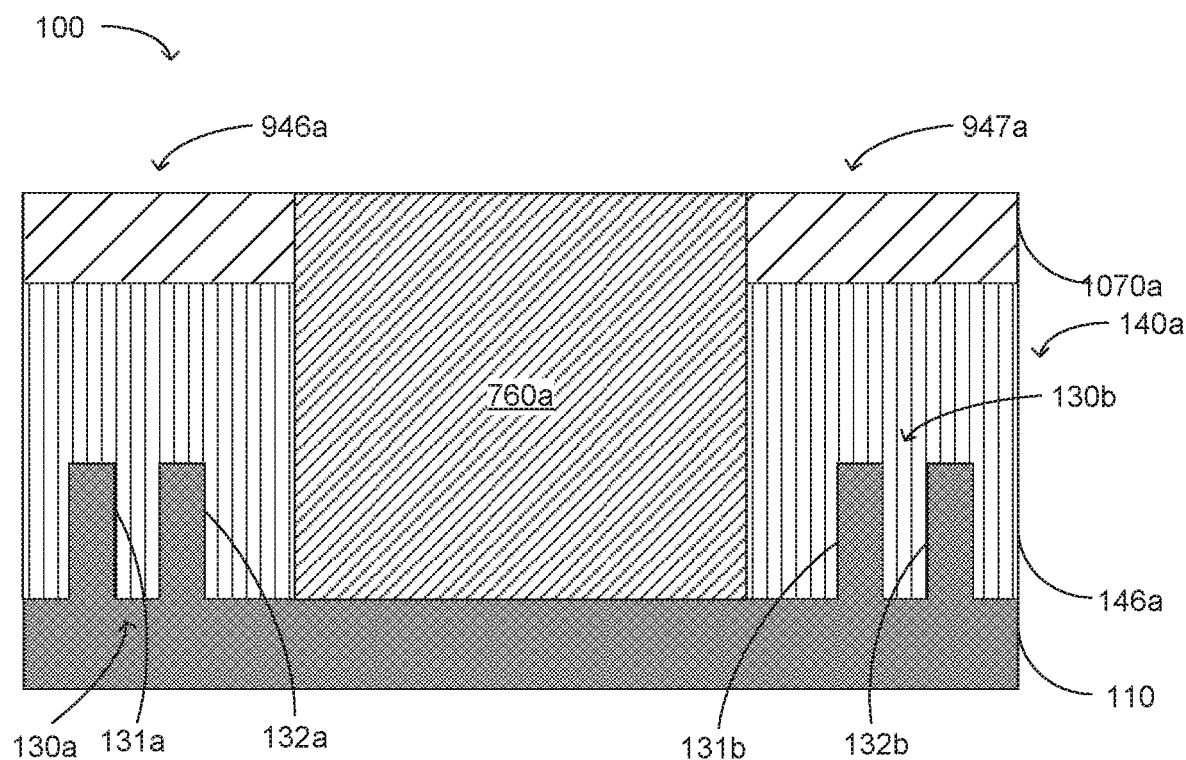
FIG. 10 illustrates an X1-cut view of a semiconductor device after a fifth stage of processing, in accordance with embodiments herein.
Figure 11:
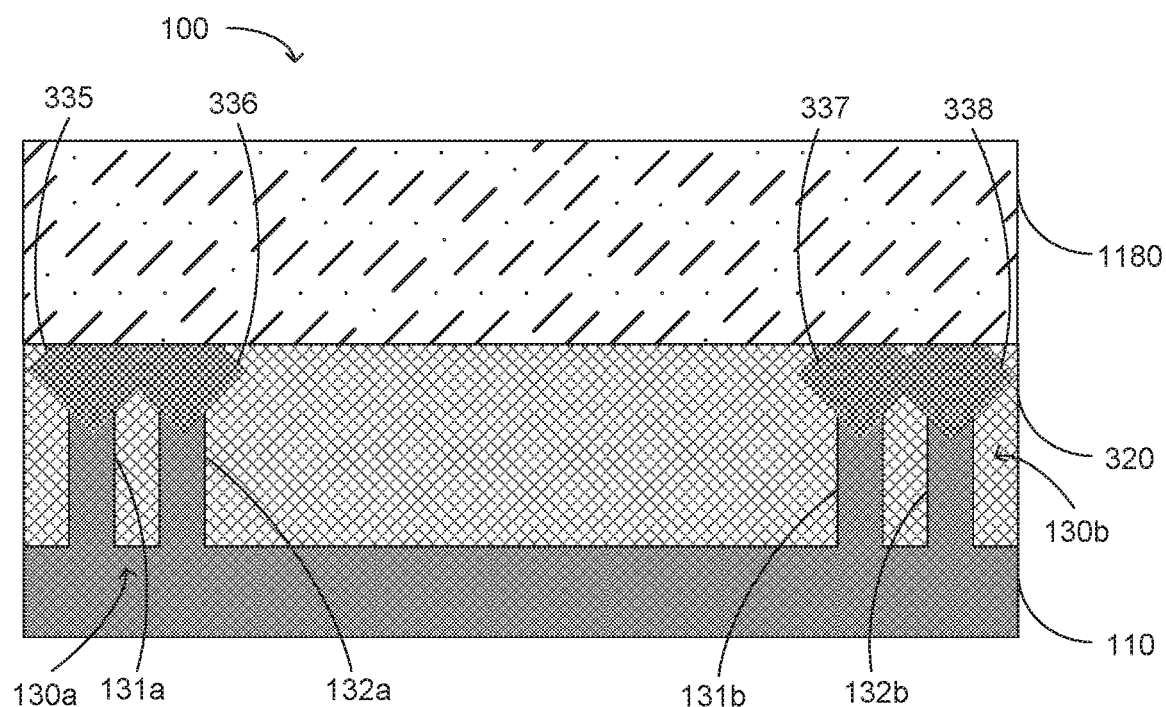
FIG. 11 illustrates an X2-cut view of a semiconductor device after the fifth stage of processing, in accordance with embodiments herein.
Figure 12:
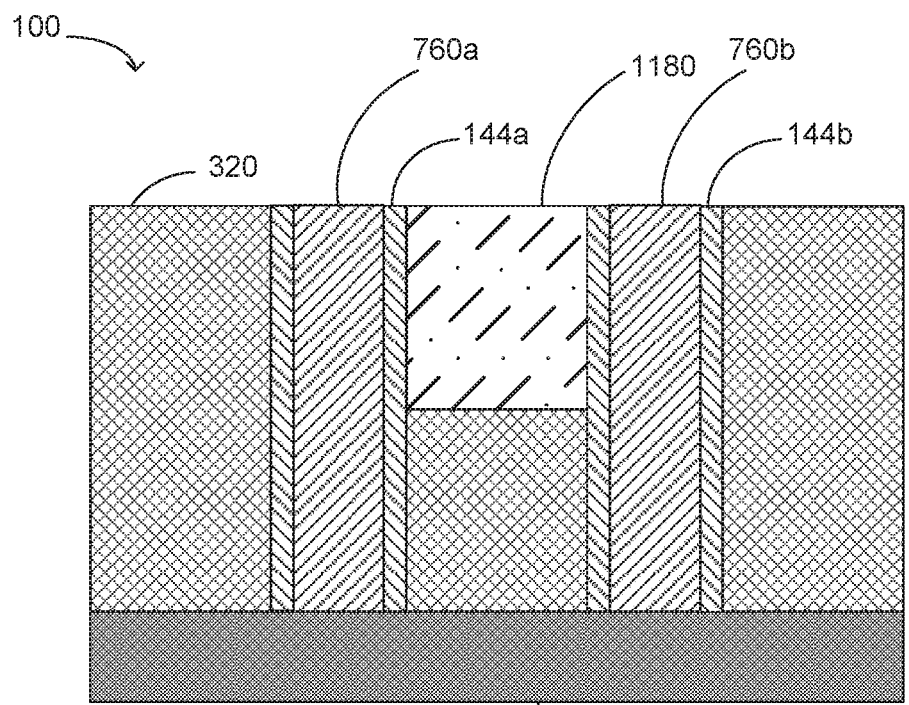
FIG. 12 illustrates a Y-cut view of a semiconductor device after the fifth stage of processing, in accordance with embodiments herein.

FIG. 10 illustrates an X1-cut view, FIG. 11 illustrates an X2-cut view, and FIG. 12 illustrates an Y-cut view of the semiconductor device 100 after a fifth stage of processing, in accordance with embodiments herein. In the fifth stage of processing, upper regions of the first and second portions 546a and 547a of the first gate electrode 146a are recessed by known techniques, and a second isolation material 1070a is deposited over the first gate electrode 146a. The same actions are performed on the second gate structure 140b (not shown). The second isolation material 1070a may be the same as the first isolation material which the first and second isolation structures 760a and 760b comprise or may be a different isolation material.

Also in the fifth stage of processing, an upper portion of the isolation material 320 may be etched back by known techniques and a contact 1180 to the S/D structures 335-338 may be formed. In the depicted embodiment, the contact 1180 (which may be termed a "conductive structure") contacts every S/D structure 335-338 between the first gate structure 140a and the second gate structure 140b.

In the depicted embodiment of FIG. 11, upper portions of the S/D structures 335-338 are also etched back, but this is not required. FIG. 12 shows the contact 1180 in physical contact with the spacers 144a and 144b on the sides of the first and second isolation structures 760a and 760b of the first and second gate regions 140a and 140b, but in other embodiments, not shown, some of the isolation material 320 may be disposed between the contact 1180 and one or both of the spacers 144a and 144b. The contact 1180 may comprise any suitable metal, such as copper, aluminum, or tungsten.

Figure 13:
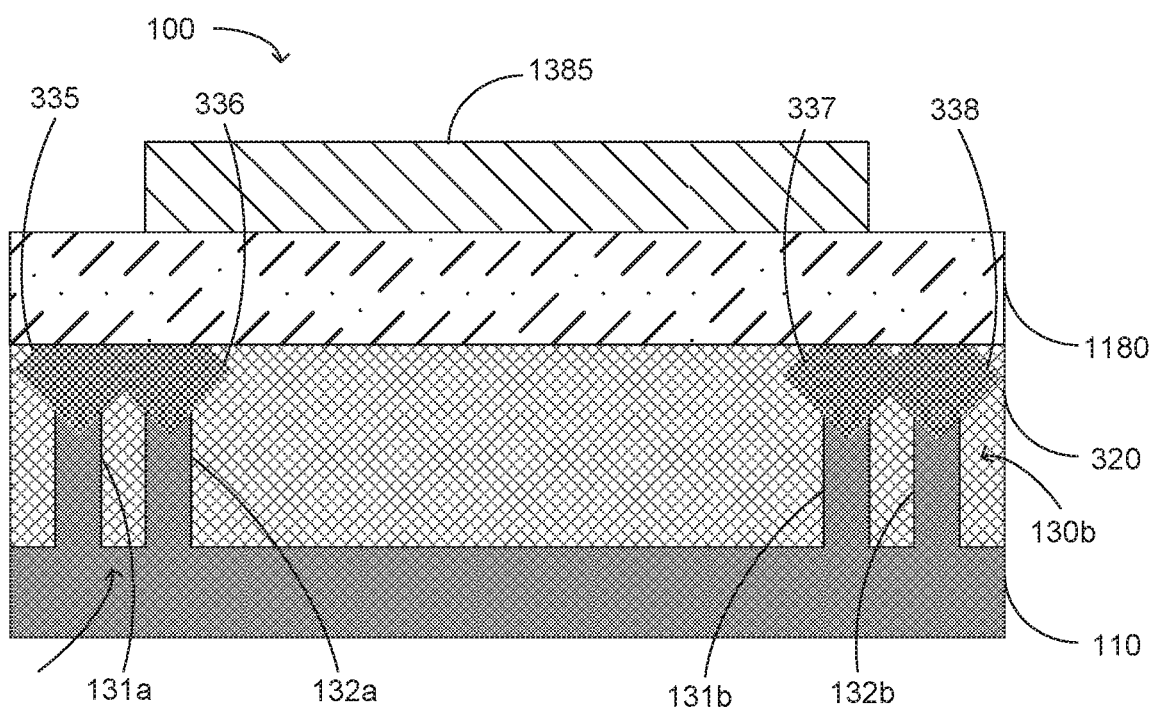
FIG. 13 illustrates an X2-cut view of a semiconductor device after a sixth stage of processing, in accordance with embodiments herein.
Figure 14:
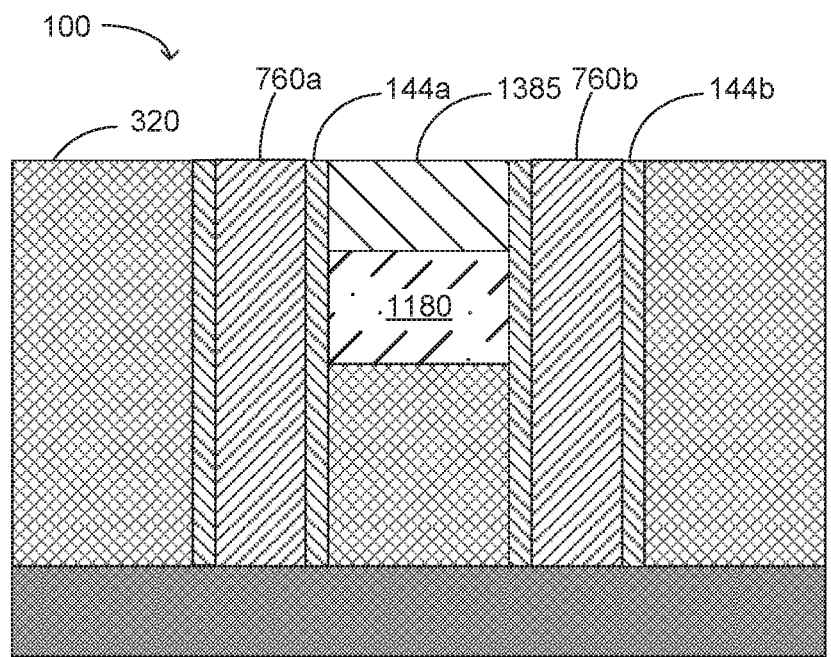
FIG. 14 illustrates a Y-cut view of a semiconductor device after the sixth stage of processing, in accordance with embodiments herein.

FIG. 13 illustrates an X2-cut view and FIG. 14 illustrates a Y-cut view of the semiconductor device 100 after a sixth stage of processing, in accordance with embodiments herein. In the sixth stage of processing, the contact 1180 may be recessed and a capping layer 1385 may be formed and patterned over the contact 1180. Techniques for recessing contacts and forming and patterning capping layers are known in the art. In one embodiment, the capping layer 1385 may comprise silicon nitride.

Figure 15:
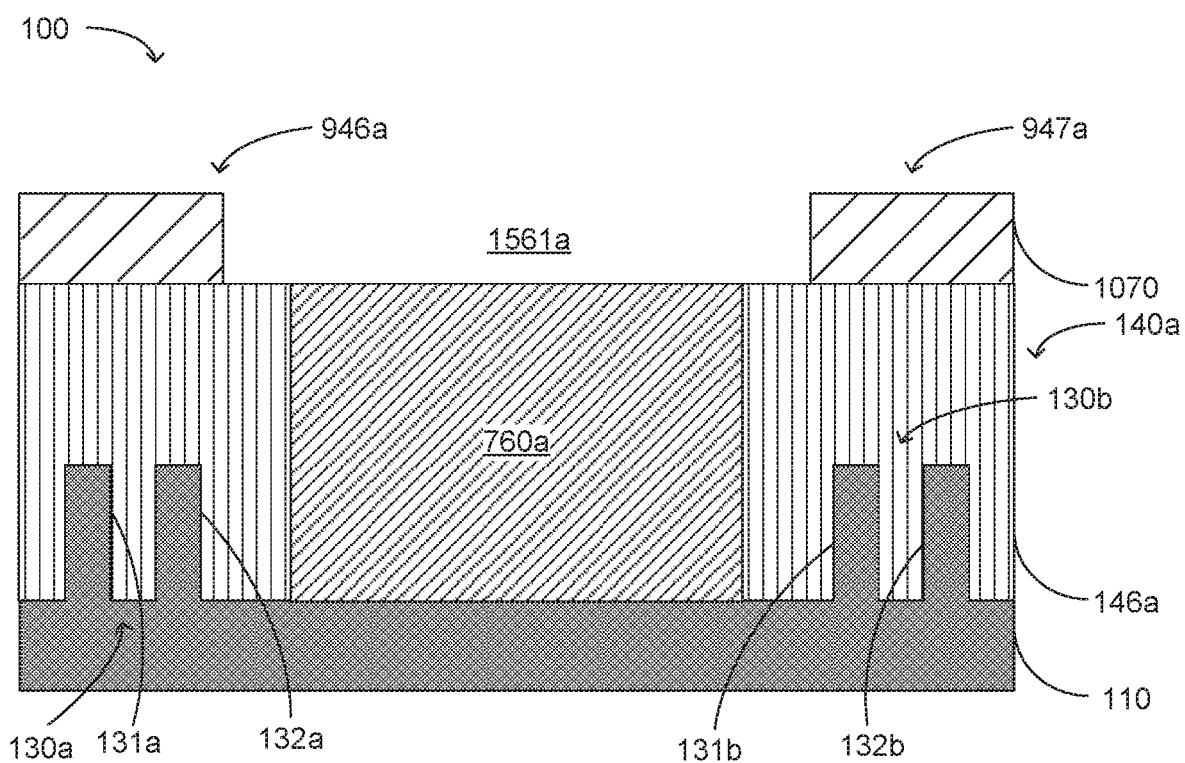
FIG. 15 illustrates an X1-cut view of a semiconductor device after a seventh stage of processing, in accordance with embodiments herein.
Figure 16:
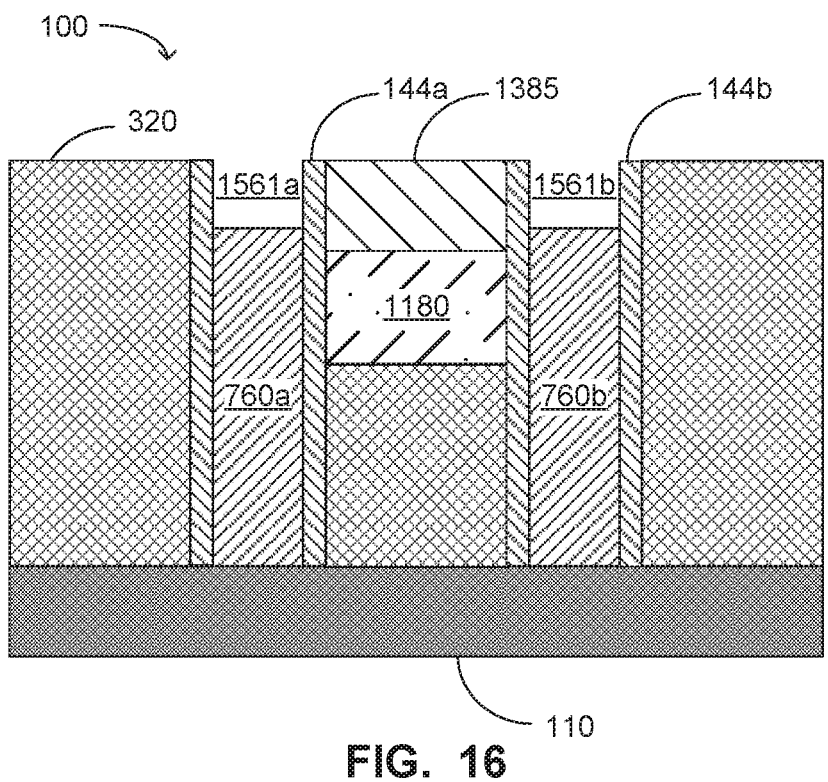
FIG. 16 illustrates a Y-cut view of a semiconductor device after the seventh stage of processing, in accordance with embodiments herein.

FIG. 15 illustrates an X1-cut view and FIG. 16 illustrates a Y-cut view of the semiconductor device 100 after a seventh stage of processing, in accordance with embodiments herein. In the seventh stage of processing, a third trench 1561a and a fourth trench 1561b are formed in the second isolation material, such as by known techniques. The third trench 1561a exposes an entirety of a top of the first isolation structure 760a, at least a part of a top of the first portion 946a of the first gate structure 140a, and at least a part of a top of the second portion 947a of the first gate structure 140a. Similarly, though not explicitly shown, the fourth trench 1561b exposes an entirety of a top of the second isolation structure 760b, at least a part of a top of the first portion of the second gate structure 140a, and at least a part of a top of the second portion of the second gate structure 140b.

Figure 17:
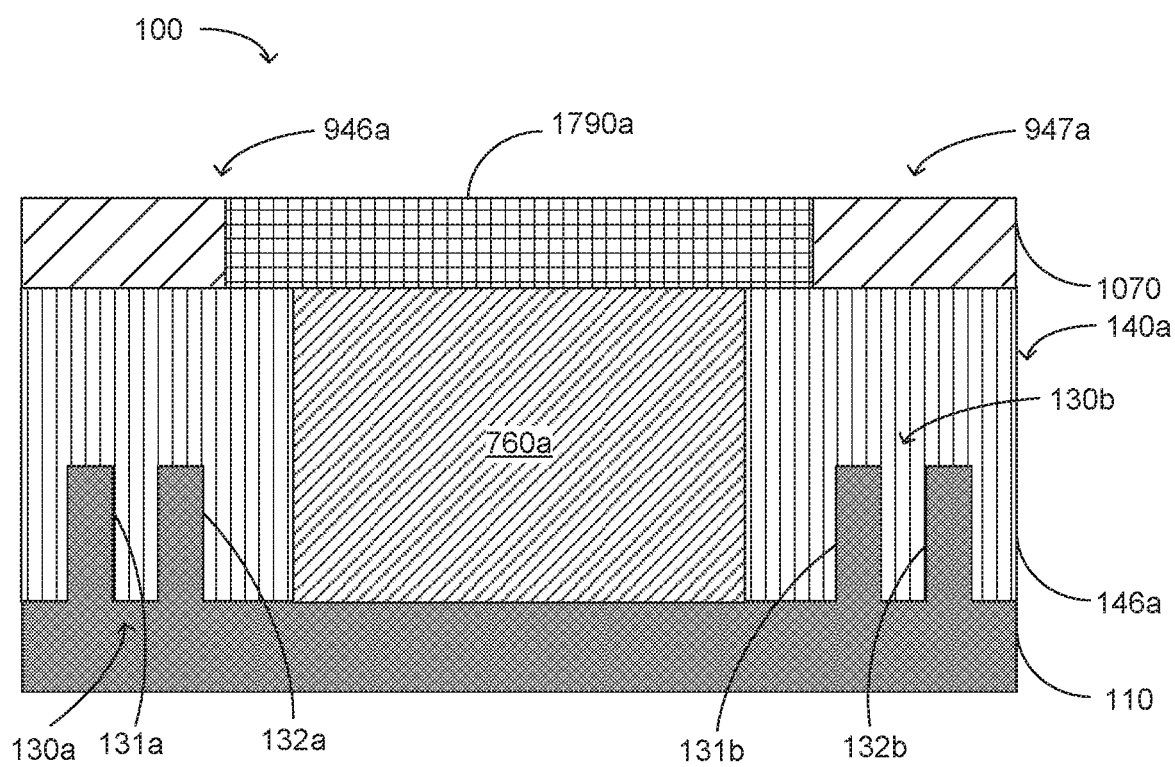
FIG. 17 illustrates an X1-cut view of a semiconductor device after an eighth stage of processing, in accordance with embodiments herein.
Figure 18:
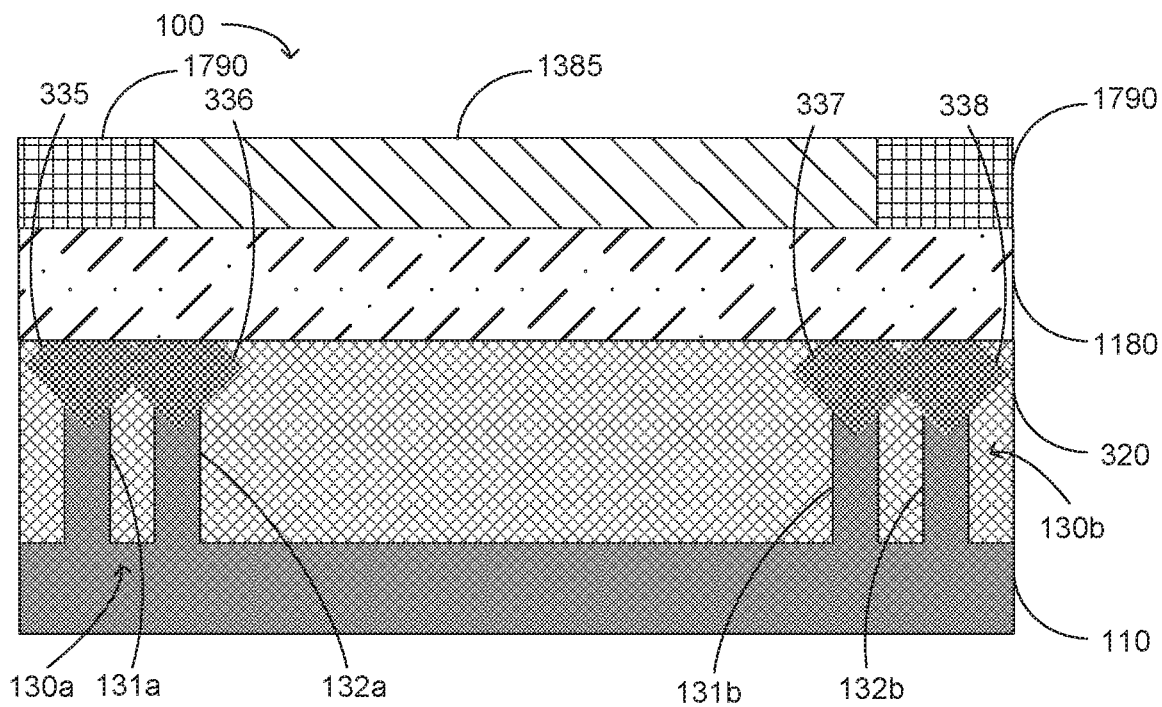
FIG. 18 illustrates an X2-cut view of a semiconductor device after the eighth stage of processing, in accordance with embodiments herein.
Figure 19:
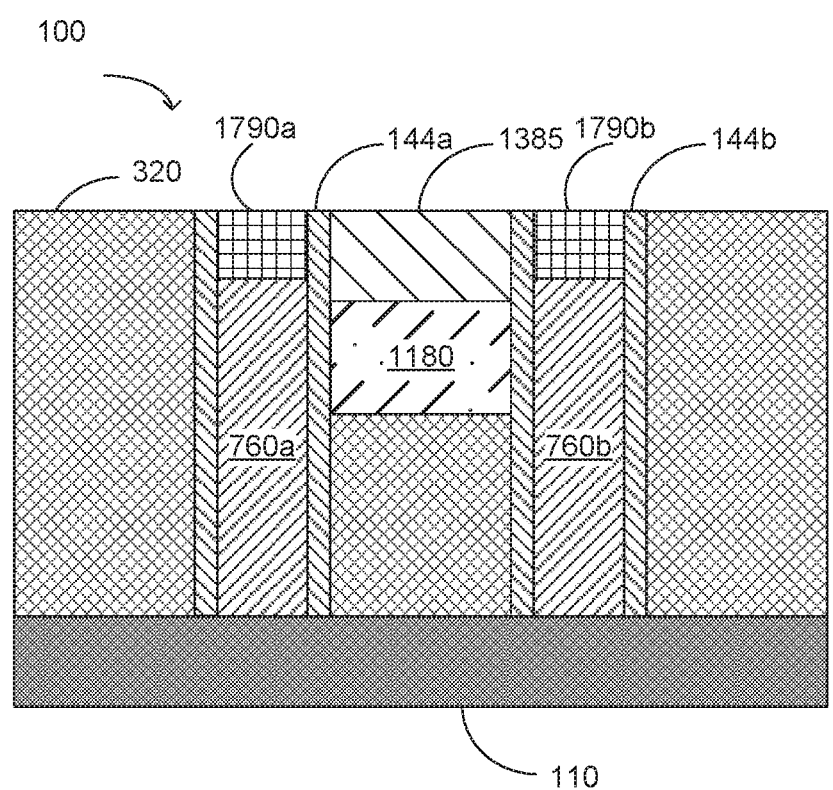
FIG. 19 illustrates a Y-cut view of a semiconductor device after the eighth stage of processing, in accordance with embodiments herein.

FIG. 17 illustrates a X1-cut view, FIG. 18 illustrates an X2-cut view, and FIG. 19 illustrates a Y-cut view of the semiconductor device 100 after an eighth stage of processing, in accordance with embodiments herein. In the eighth stage of processing, the third trench 1561a and the fourth trench 1561b are filled with a conductive material 1790. The conductive material 1790 may also be deposited over portions of the contact 1180 that are not covered by capping layer 1385. The conductive material 1790 may be a metal, such as copper, aluminum, or tungsten. The conductive material 1790 may be the same as the material of the contact 1180, but need not be. Filling the third and fourth trenches 1561a-1561b with the conductive material 1790 may be performed as a routine matter by the person of ordinary skill in the art having the benefit of the present disclosure.

As can be seen in FIG. 17, a region 1790a of the conductive material provides an electrical connection between the portions 946a and 947a of the first gate electrode 146a. Similarly, though not explicitly shown, a region 1790b of the conductive material provides an electrical connection between first and second portions of the second gate electrode 146b.

FIGS. 18-19 also show that the capping layer 1385 and the first and second isolation structures 760a and 760b provide electrical insulation between the contact 1180 and e.g. the first gate electrode 146a. Accordingly, the parasitic capacitance of the semiconductor device 100 is low and the device performance is high.

After the eighth stage of processing, additional processing steps that will be known to the person of ordinary skill in the art can be performed to render the semiconductor device 100 suitable for one or more desired applications.

In one embodiment, the various stages of processing depicted in FIGS. 2-20, and others that will be apparent to the person of ordinary skill in the art having the benefit of the present disclosure, may yield a semiconductor device 100, comprising a semiconductor substrate 110; a first set of fins 130a and a second set of fins 130b disposed on the semiconductor substrate, wherein every fin 131a-132b comprises a long axis and a short axis, wherein the long axes of the fins 131a-132b are substantially parallel and extend in a first direction; a first gate electrode 146a and a second gate electrode over the semiconductor substrate 110, the first set of fins 130a, and the second set of fins 130b, wherein each gate electrode comprises a long axis and a short axis, wherein the long axes of the first and second gate electrodes are substantially parallel and extend in a second direction, wherein the second direction is substantially perpendicular to the first direction; a first isolation structure 760a disposed between the first set of fins 130a and the second set of fins 130b and on the semiconductor substrate 110, wherein the first isolation structure 760a separates the first gate electrode 146a into a first portion 946a and a second portion 947a; a second isolation structure 760b disposed between the first set of fins 130a and the second set of fins 130b and on the semiconductor substrate 110, wherein the second isolation structure 760b separates the second gate electrode into a first portion and a second portion; a third isolation structure 1070 disposed on a first part of a top of each of the first and second portions 946a and 947a of the first gate electrode 146a; a fourth isolation structure disposed on a first part of a top of each of the first and second portions of the second gate electrode; a first conductive structure 1790a wider than the first isolation structure 760a and disposed on an entirety of a top of the first isolation structure 760a and on a second part of the top of each of the first and second portions 946a and 947a of the first gate electrode 146a; and a second conductive structure 1790b wider than the second isolation structure 760b and disposed on an entirety of a top of the second isolation structure 760b and on a second part of the top of each of the first and second portions of the second gate electrode 146b.

In one embodiment, the semiconductor device 100 may further comprise epitaxial source/drain (S/D) structures 335-338 on every fin 131a-132b between the first gate electrode 146a and the second gate electrode 146b. In a further embodiment, the semiconductor device 100 may still further comprise a second conductive structure 1180 that contacts every S/D structure 335-338 between the first gate electrode 146a and the second gate electrode 146b.

Alternatively or in addition, the semiconductor substrate 110 may comprise silicon.

Alternatively or in addition, the first isolation structure 760a and/or the second isolation structure 760b may comprise silicon nitride. The first isolation structure 760a and the second isolation structure 760b may comprise a common material, but need not.

Figure 20:
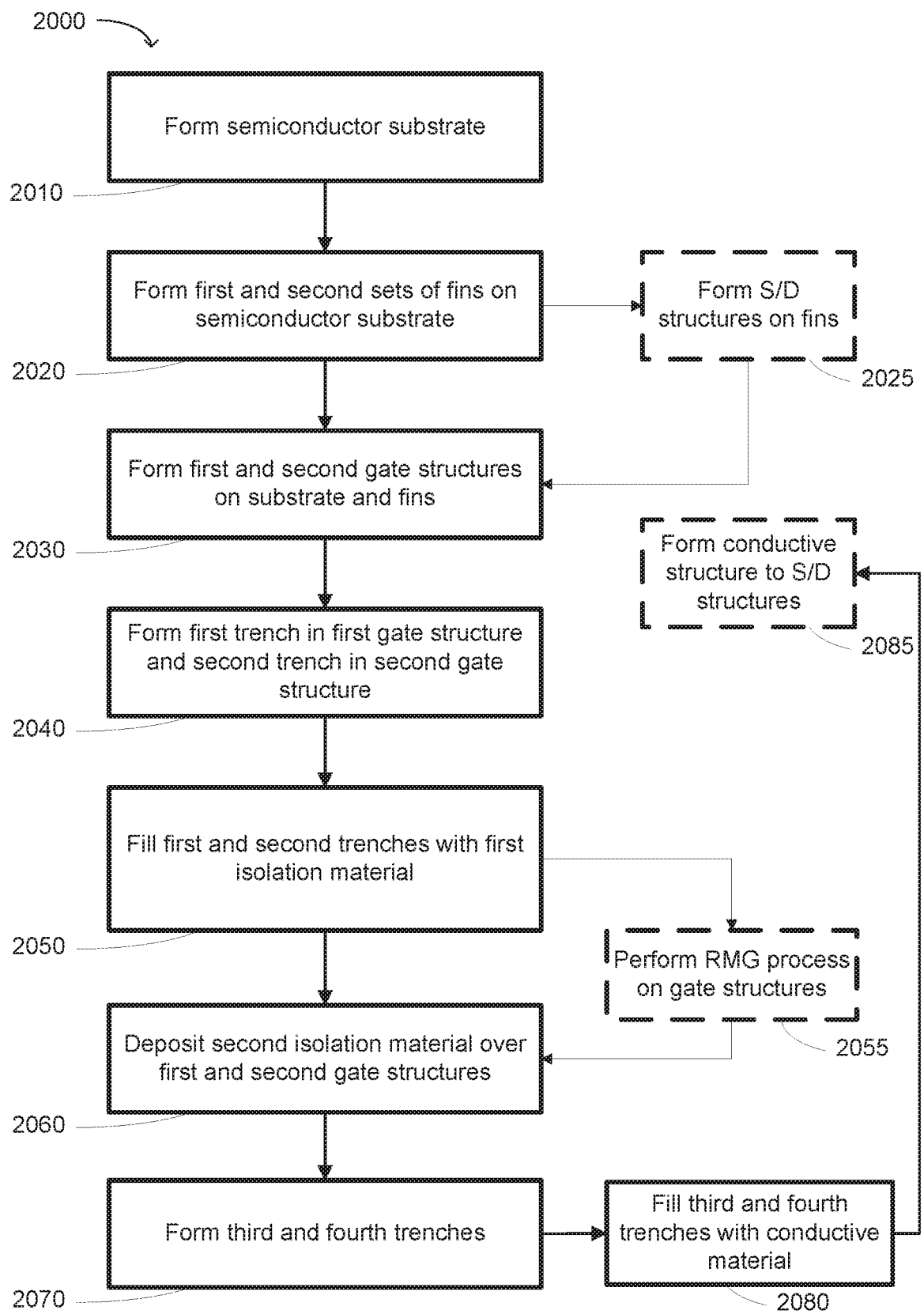
FIG. 20 illustrates a flowchart of a method, in accordance with embodiments herein.

FIG. 20 provides a flowchart of a method 2000, in accordance with embodiments herein. As depicted, the method 2000 comprises forming (at 2010) a semiconductor substrate. In one embodiment, the semiconductor substrate may comprise silicon.

The method 2000 also comprises forming (at 2020) a first set of fins and a second set of fins on the semiconductor substrate, wherein every fin comprises a long axis and a short axis, wherein the long axes of the fins are substantially parallel and extend in a first direction; and forming (at 2030) a first gate structure and a second gate structure over the semiconductor substrate, the first set of fins, and the second set of fins, wherein each gate structure comprises a long axis and a short axis, wherein the long axes of the first and second gate structures are substantially parallel and extend in a second direction, wherein the second direction is substantially perpendicular to the first direction.

In one embodiment, the method 2000 may comprise forming (at 2025), such as by growing epitaxially, source/drain (S/D) structures on every fin between the first gate structure and the second gate structure.

In the method 2000, the forming (at 2030) may comprise forming a first dummy gate and a second dummy gate.

The method 2000 further comprises forming (at 2040) a first trench in the first gate structure and a second trench in the second gate structure, wherein each trench is formed between the first set of fins and the second set of fins and exposes the semiconductor substrate.

The method 2000 additionally comprises filling (at 2050) the first trench and the second trench with a first isolation material, to yield a first isolation structure and a second isolation structure, wherein the first gate structure has a first portion and a second portion separated by the first isolation structure and the second gate structure has a first portion and a second portion separated by the second isolation structure. In one embodiment, the first isolation material may comprise silicon nitride.

In one embodiment, the method 2000 may comprise performing (at 2055) a replacement metal gate (RMG) process, thereby replacing the first dummy gate with a first gate electrode and the second dummy gate to a second gate electrode, after filling the first and second trenches and before depositing a second isolation material (at 2060).

The method 2000 may subsequently comprise depositing (at 2060) a second isolation material over at least the first gate structure and the second gate structure. In one embodiment, the first isolation material and the second isolation material comprise a common material.

The method 2000 may then involve forming (at 2070) a third trench and a fourth trench in the second isolation material, wherein the third trench exposes an entirety of a top of the first isolation structure, at least a part of a top of the first portion of the first gate structure, and at least a part of a top of the second portion of the first gate structure, and the fourth trench exposes an entirety of a top of the second isolation structure, at least a part of a top of the first portion of the second gate structure, and at least a part of a top of the second portion of the second gate structure. Subsequently, the method 2000 comprises filling (at 2080) the third and fourth trenches with a conductive material.

In one embodiment, wherein the method 2000 comprises forming (at 2025) S/D structures, the method 2000 may further comprise forming (at 2085) one conductive structure that contacts every S/D structure between the first gate structure and the second gate structure.

Figure 21:
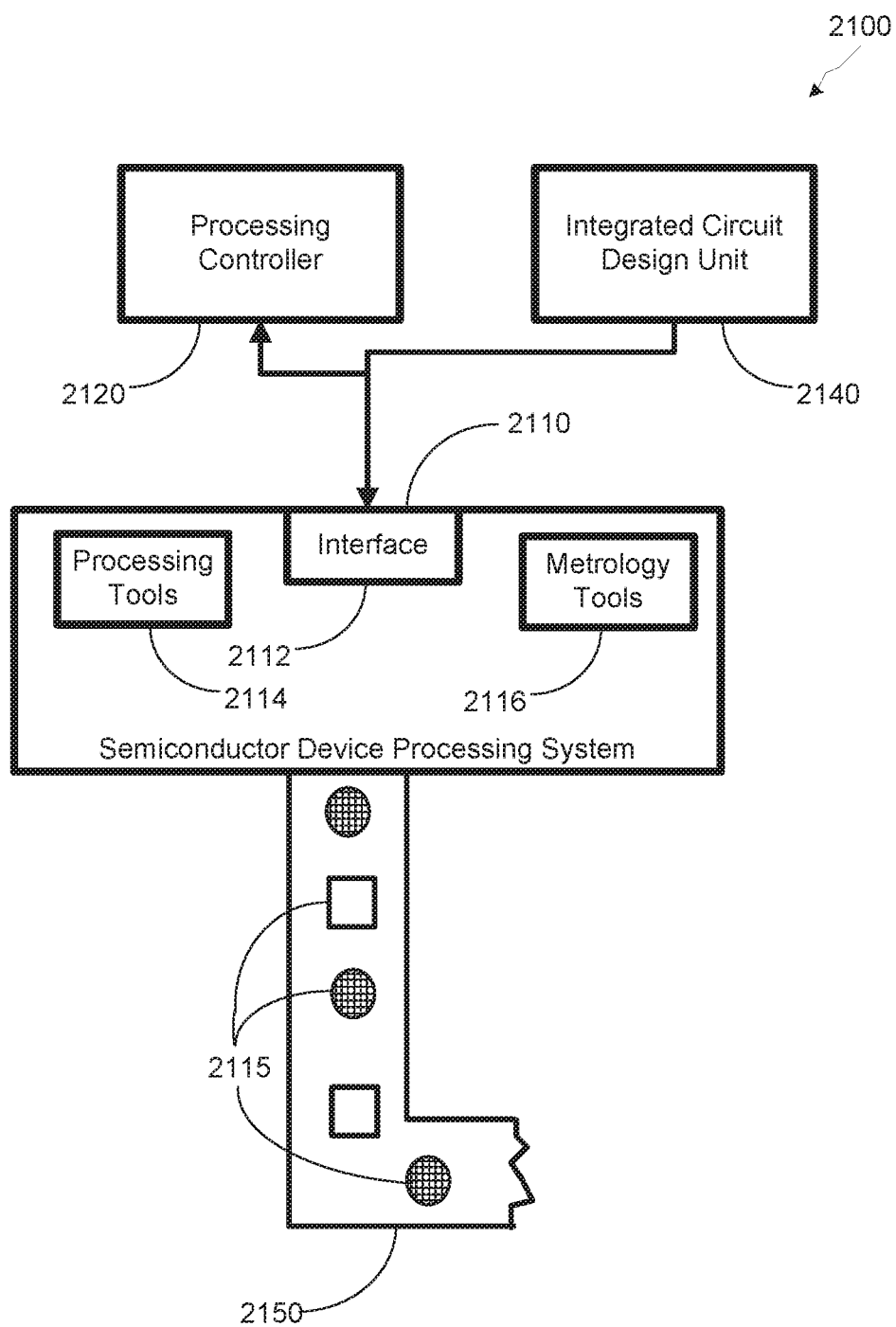
FIG. 21 illustrates a stylized depiction of a system for fabricating a semiconductor device, in accordance with embodiments herein.

Turning now to FIG. 21, a stylized depiction of a system 2100 for fabricating a semiconductor device, in accordance with embodiments herein, is illustrated. A system 2100 of FIG. 21 may comprise a semiconductor device processing system 2110 and an integrated circuit design unit 2140. The semiconductor device processing system 2110 may manufacture integrated circuit devices based upon one or more designs provided by the integrated circuit design unit 2140.

The semiconductor device processing system 2110 may comprise various processing stations, such as etch process stations, photolithography process stations, CMP process stations, etc. Each of the processing stations may comprise one or more processing tools 2114 and or metrology tools 2116. Feedback based on data from the metrology tools 2116 may be used to modify one or more process parameters used by the processing tools 2114 for performing process steps.

The semiconductor device processing system 2110 may also comprise an interface 2112 that is capable of providing communications between the processing tools 2114, the metrology tools 2116, and a controller, such as the processing controller 2120. One or more of the processing steps performed by the semiconductor device processing system 2110 may be controlled by the processing controller 2120. The processing controller 2120 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 2110 may produce integrated circuits on a medium, such as silicon wafers. More particularly, the semiconductor device processing system 2110 may produce integrated circuits comprising a semiconductor device 100.

The production of integrated circuits by the semiconductor device processing system 2110 may be based upon circuit designs provided by the integrated circuit design unit 2140. The semiconductor device processing system 2110 may provide processed integrated circuits/devices 2115 on a transport mechanism 2150, such as a conveyor system. In some embodiments, the conveyor system may be sophisticated clean room transport systems that are capable of transporting semiconductor wafers.

In some embodiments, the items labeled "2115" may represent individual wafers, and in other embodiments, the items 2115 may represent a group of semiconductor wafers, e.g., a "lot" of semiconductor wafers. The integrated circuit or device 2115 may comprise a transistor, a capacitor, a resistor, a memory cell, a processor, and/or the like.

The integrated circuit design unit 2140 of the system 2100 is capable of providing a circuit design that may be manufactured by the semiconductor device processing system 2110. The integrated circuit design unit 2140 may be capable of determining the number of devices (e.g., processors, memory devices, etc.) to place in a device package. Further, the integrated circuit design unit 2140 may be capable of determining a number of fins per set of fins, a separation between fins within a set, a separation of sets of fins, one or more dimensions of fins, a number of gates, a separation between gates, one or more dimensions of gates, and/or one or more other properties of a semiconductor device 100 described above. Based upon such details of the devices, the integrated circuit design unit 2140 may determine specifications of the devices that are to be manufactured. Based upon these specifications, the integrated circuit design unit 2140 may provide data for manufacturing a semiconductor device 100 package described herein.

The system 2100 may be capable of performing analysis and manufacturing of various products involving various technologies. For example, the system 2100 may receive design and production data for manufacturing devices of CMOS technology, Flash technology, BiCMOS technology, power devices, memory devices (e.g., DRAM devices), NAND memory devices, and/or various other semiconductor technologies. This data may be used by the system 2100 to fabricate semiconductor devices described herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
    a semiconductor substrate;
    a first set of fins and a second set of fins disposed on the semiconductor substrate, wherein every fin comprises a long axis and a short axis, wherein the long axes of the fins are substantially parallel and extend in a first direction;
    a first gate electrode and a second gate electrode over the semiconductor substrate, the first set of fins, and the second set of fins, wherein each gate electrode comprises a long axis and a short axis, wherein the long axes of the first and second gate electrodes are substantially parallel and extend in a second direction, wherein the second direction is substantially perpendicular to the first direction;
    a first isolation structure disposed between the first set of fins and the second set of fins and on the semiconductor substrate, wherein a top of the first isolation structure is above a top of every fin of the first set of fins and the second set of fins, the top of the first isolation structure is at the same height as a top of the first gate electrode, a bottom of the first isolation structure is at the same height as a top of the semiconductor substrate and a bottom of every fin of the first set of fins and the second set of fins, and wherein the first isolation structure separates the first gate electrode into a first portion and a second portion;
    a second isolation structure disposed between the first set of fins and the second set of fins and on the semiconductor substrate, wherein a top of the second isolation structure is above the top of every fin of the second set of fins and the second set of fins, the top of the second isolation structure is at the same height as a top of the second gate electrode, a bottom of the second isolation structure is at the same height as the top of the semiconductor substrate and the bottom of every fin of the second set of fins and the second set of fins, and wherein the second isolation structure separates the second gate electrode into a first portion and a second portion;

a third isolation structure disposed on a first part of a top of each of the first and second portions of the first gate electrode; a fourth isolation structure disposed on a first part of a top of each of the first and second portions of the second gate electrode;

a first conductive structure wider than the first isolation structure and disposed on an entirety of a top of the first isolation structure and on a second part of the top of each of the first and second portions of the first gate electrode, wherein a bottom of the first conductive structure is at the same height as the top of the first gate electrode and the top of the first isolation structure; and a second conductive structure wider than the second isolation structure and disposed on an entirety of a top of the second isolation structure and on a second part of the top of each of the first and second portions of the second gate electrode, wherein a bottom of the second conductive structure is at the same height as the top of the second gate electrode and the top of the second isolation structure.

2. The semiconductor device of claim 1, wherein the first isolation structure and the second isolation structure comprise a common material.

3. The semiconductor device of claim 1, wherein the first isolation structure comprises silicon nitride.

4. The semiconductor device of claim 1, wherein the semiconductor substrate comprises silicon.

5. The semiconductor device of claim 1, further comprising:
   epitaxial source/drain (S/D) structures on every fin between the first gate electrode and the second gate electrode.

6. The semiconductor device of claim 5, further comprising:
   a third conductive structure that contacts every S/D structure between the first gate electrode and the second gate electrode.

* * * * *